(12) United States Patent
Gardei et al.

(10) Patent No.: US 6,369,634 B1
(45) Date of Patent: Apr. 9, 2002

(54) DELAY SYSTEMS AND METHODS USING A VARIABLE DELAY SINC FILTER

(75) Inventors: William F. Gardei, Derry; Douglas F. Pastorello, Hudson, both of NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/484,128

(22) Filed: Jan. 15, 2000

(51) Int. Cl.[7] ............................................... H03H 11/26
(52) U.S. Cl. ..................... 327/276; 327/279; 327/552
(58) Field of Search ................................. 327/551, 552, 327/553, 555–560, 276, 277, 278, 279

(56) References Cited

U.S. PATENT DOCUMENTS

| | | | | |
|---|---|---|---|---|
| 4,038,539 A | * | 7/1977 | Van Cleave | 327/553 |
| 5,107,220 A | * | 4/1992 | Andoh | 327/552 |
| 5,429,001 A | * | 7/1995 | Kleven | 327/552 |
| 5,440,817 A | * | 8/1995 | Watson et al. | 33/366 |
| 5,946,400 A | * | 8/1999 | Matsuo | 381/17 |
| 5,952,876 A | * | 9/1999 | Sakoda et al. | 327/552 |
| 5,982,228 A | * | 11/1999 | Khorramabadi et al. | 327/553 |

\* cited by examiner

*Primary Examiner*—Timothy P. Callahan
*Assistant Examiner*—An T. Luu
(74) *Attorney, Agent, or Firm*—Steven Lin, Esq.

(57) ABSTRACT

A delay system includes a first filter configured for receiving a selected input signal and a first mechanism for activating the first filter to produce a delayed output signal which is a function of a selected input signal. The delay system filter includes a second filter configured for receiving a signal from said first filter to apply an additional delay to the signal received by said first filter, and a second mechanism for activating the second filter to produce a delayed signal which is a function of a signal received from the first filter. The delay system further comprises a divider system for tracking times from a clock reference. The delay system implements a method of delaying a received signal by sampling a selected signal with a predetermined clock signal and producing the selected signal at a time delayed to the extent of a comparison of a reduced frequency clock with a predetermined value. The method filter includes further delaying production of the selected signal with a second comparison utilizing a second predetermined value of a further reduced frequency clock.

26 Claims, 2 Drawing Sheets

100 (or any other kind of filter), a divider system 101, and a finite impulse response (FIR) filter or an infinite impulse response (IIR) filter 102. The SINC filter 100 is included in delay system 99 to provide a selectably variable delay amount to an input signal which is to be delayed. The divider system 101 according to one embodiment includes first and second dividers 103 and 104. The delay system 99 further includes a third divider 105, a first comparator 106, a first register connected to comparator 106, with the microprocessor 108 connected to register 107. Additionally, delay system 99 includes a second comparator 116 and a second register 117, with the microprocessor 108 connected to the second register 117. The divider 103 is optionally provided with an associated comparator and register (not shown), analogous to the comparator 106 and register 107, if a finer adjustment is needed for this stage of signal processing.

According to one embodiment of the present invention, the SINC filter 100 includes first and second stages, an integrator 121 and a differentiator or comb 122 connected to the integrator 121 at its output terminal. The first stage integrator 121 operates at a high sample rate. The output of the integrator 121 is connected to the differentiator 122 which operates at a lower rate of signal sampling. According to one embodiment of the present invention, the integrator sampling rate in this implementation is 64 times the differentiator or comb sampling rate. The time of sampling by the comb 122 is controlled by a comparator output from comparator 106, which actuates when the content of a writeable register 107, written to/from the controller or microprocessor 108, is equal to the output of a divide counter 104. The divide counter 104 is the second stage of a divider system including respective first and second divide-by-eight dividers 103 and 104. The time of sampling by the FIR/IIR filter 102 is controlled by the output from comparator 116, which actuates when the content of register 117 written to/from controller or microprocessor 108, is equal to the output of the third divide counter 105. According to one embodiment of the present invention, the second register 117 is a single bit register. According to one embodiment, the SINC filter 100 provides a fine delay, and the FIR/IIR filter 102 provides a coarse adjustment delay amount.

Referring now to FIG. 2, there is shown a phase compensation delay cell system 699 for a digital signal received at a first frequency, which comprises a bit stream from a modulator (not shown), according to the present invention. According to one embodiment of the present invention, the phase compensation delay cell system 699 is implemented in a voltage channel. In particular, the phase compensation delay cell system 699 includes a first delay cell 701 and a sinc filter 702 connected to the output terminal of the first delay cell 701. The first delay cell 701 permits the application of a selected incremental delay amount to an input signal received, for example, from a delta sigma analog to digital converter at its particular frequency. The selected delay amount is determined by engaging selected delay elements in the first delay cell 701. The phase compensation delay cell system 699) further includes a decimation element 703 which is effected as part of the sinc filter 702 according to one embodiment of the present invention, even though it is shown as a separate element in the FIG. The decimation element 703 reduces the signal frequency by a factor of 64, according to one embodiment.

The phase compensation delay cell system 699 further includes a second delay cell 704, and a finite impulse

DELAY SYSTEMS AND METHODS USING A VARIABLE DELAY SINC FILTER

BACKGROUND OF THE INVENTION

1. Field of the Invention

This invention relates to power and energy measurement systems and methods, and more particularly to single phase bi-directional power and energy systems and methods which are configured on a single semiconductor chip.

2. Description of the Related Art

Power and energy measurement systems of many kinds are well-known. Many of such systems are electromechanical. Many of such systems are inaccurate. Some of such systems consume excessive power.

There is a need for accurate power and energy measurement systems having enhanced functionality, which are nonetheless inexpensive and which consume reduced energy levels to operate.

SUMMARY OF THE INVENTION

According to the present invention, phase compensation is implemented with a reduced number of registers. According to the present invention, a SINC filter is used to provide a selectable variable delay. According to one embodiment of the present invention, a SINC filter includes first and second stages. A first stage includes an integrator operating at a high signal sampling rate. The output of the integrator is connected to a differentiator or a comb, which operates at a lower rate of signal sampling. According to one embodiment of the present invention, the integrator sampling rate is at least twice the differentiator or comb sampling rate. The time of sampling by the comb is controlled by a comparator output, which actuates when the content of a writeable register, written to/from a controller, is equal to the output of a divide counter. The divide counter is the second stage of a divider system including first and second divide-by-eight dividers.

According to one embodiment of the present invention, a power and energy measurement system of enhanced accuracy performs a plurality of functions including energy and power measurement, root mean square voltage and root mean square current determination, and energy to pulse-rate conversion. The measurement system has reduced power consumption and an interface which is optimized for operation with a shunt sensor. The measurement system includes a phase compensation system and operates with ground-referenced signals and a single power supply. The system further has a calibration system including a feature for providing a settable offset useful for determining power level calculations.

DETAILED DESCRIPTION OF BEST MODES OF THE INVENTION

Figure 1:
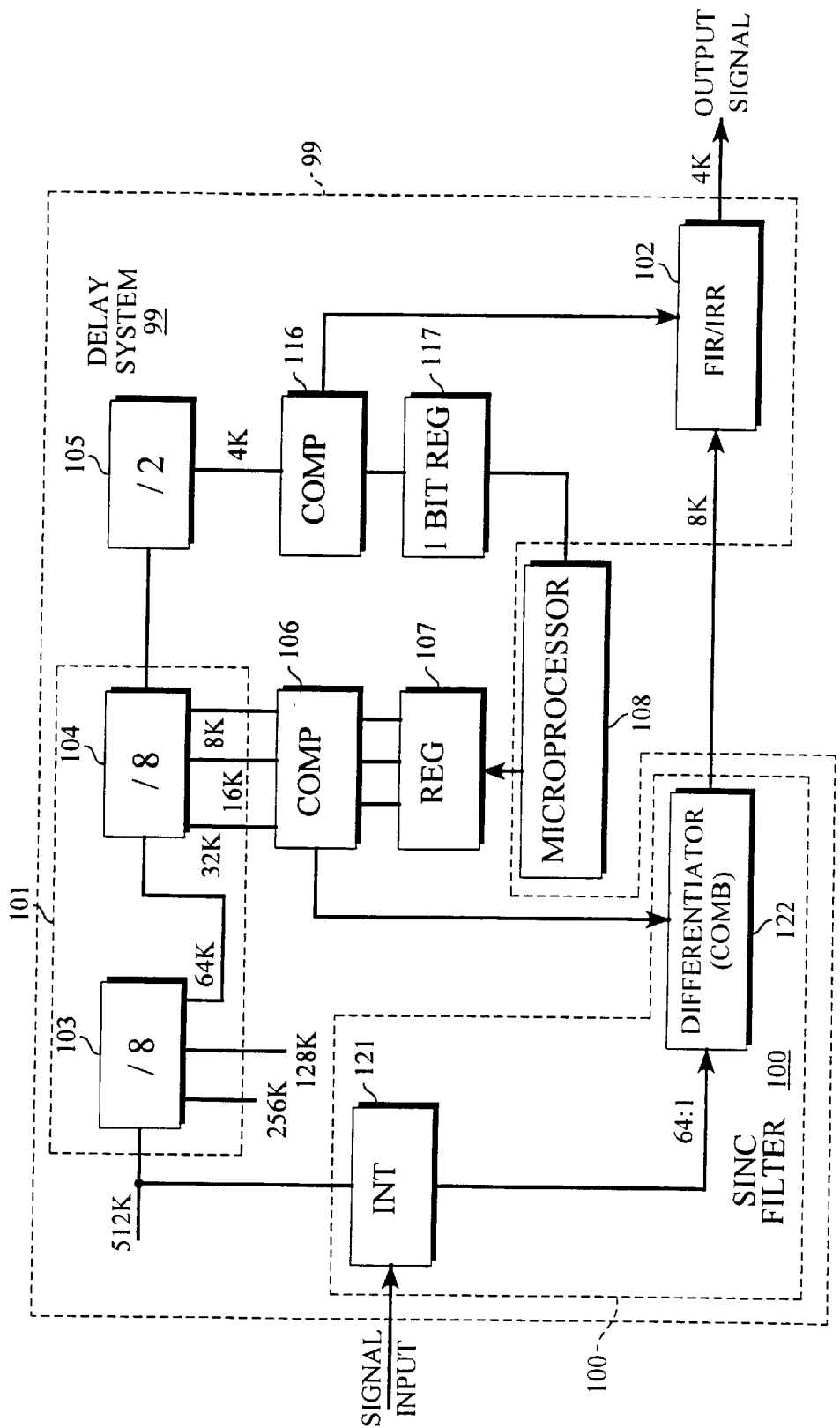
FIG. 1 is a block diagram of a multifrequency filter delay system according to the present invention.
Figure 2:
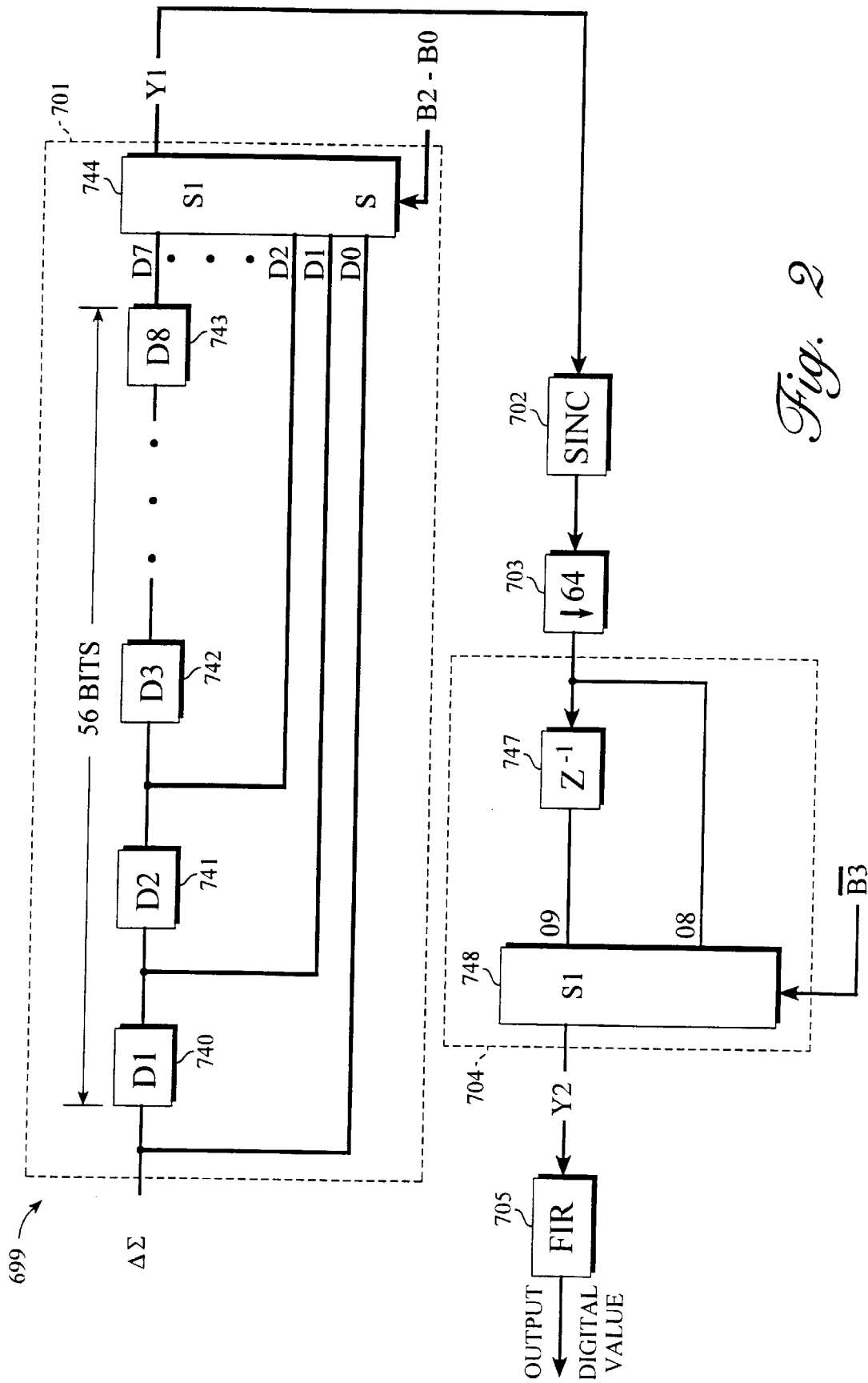
FIG. 2 is a block diagram of an alternate embodiment of a multifrequency filter delay system according to the present invention, which establishes delays with the use of an extensive register mechanism.

FIG. 1 is a diagram of a delay system 99 which works with a microprocessor or controller 108 according to one embodiment of the present invention. The controller 108 is used to set or modify register values which provide respective coarse and fine delay settings for a selected input signal, as will be discussed. According to one embodiment of the present invention, the delay system 99 includes a SINC filter response filter 705, all interconnected in series in a voltage channel. The first delay cell 701 includes a plurality of delay elements 740–743 and a selector element or multiplexer 744. The selector element 744 chooses a delayed version of the input signal from a delta sigma analog to digital converter for example and issues this signal at output terminal Y1. The delay amount provided by the first delay cell is a function of which signal line D1–D8 is selected by selector 744 according to a selection input S, where B2–B0 are programmable input signals to select desired amounts of delay from a zero delay to a cumulative delay of eight delay elements. When line D7 is selected, the delay amount represents an 8 clock delay. At a first frequency f at which the input signal is provided, this is equivalent to a delay of $d1=(8)(k1)/f$, where k1 is the numerical value contained in the input signal(s) B2–B0. Each register is a single 8-bit element, since the data comes directly from the modulator. With these registers according to one embodiment, the total register bit space required is 56 bits.

The second delay cell 704 includes a single delay element 747 and a selector element or multiplexer 748. The selector element 748 chooses a delayed version of the signal from decimator 704 and passes/issues this signal at output terminal Y2. The actual delay amount provided by the second delay cell is a function of which signal line 08–09 that is selected by selector 748 according to a selection input signal B3bar, where B3bar is the complement of a bit value B3 and determines whether to apply a predetermined delay amount to an input signal or to apply no delay amount at all. By use of the input signal B3bar, the amount of delay is programmable, as by microcontroller or microprocessor input, for example, to select desired amounts of delay from a zero delay to a total delay amount corresponding to a single delay element 747.

When B3bar is selected (e.g., B3bar="high"), the time delay amount represents a single predetermined delay amounting to a coarse delay selection. The output signal at terminal Y2 is then transmitted to a finite impulse register 705 which produces an output digital value from the finite impulse register 705. Because the signal frequency is reduced by decimation element 703, for example, by a factor of 64 or another power of 2, a delay increment which can be produced by activation of delay cell 704 is greater (i.e., coarser) than a delay increment which can be produced by the first delay cell 701. Accordingly, fine delay adjustment increments are effected by programming the first delay cell 701 through the selector 744 by properly coding bit combinations for B2–B0. A single coarse adjustment can be made by the second delay cell 704 by engaging or disengaging time delay element 747. With these first and second delay cells 701 and 704, a selected signal channel such as, for example, a voltage channel, can be provided with controllable delay amounts for digital signals communicated upon the signal channel. The delay amounts can be controlled in terms of coarse and fine adjustments, with the fine adjustments being made at a higher signal frequency, and the coarse adjustments being made at a lower signal frequency.

While the invention has been particularly shown and described with reference to a preferred embodiment, it will be understood by those skilled in the art that various changes in form and detail may be made therein without departing from the spirit and scope of the invention.

What is claimed is:

1. A delay system operable with a microprocessor or controller, the delay system comprising:
   a first filter configured for receiving a selected input signal;
   a first mechanism, including a microprocessor, for activating the filter to produce a delayed output signal which is a function of the selected input signal, the first mechanism being settable to produce a predetermined delay according to an input from the microprocessor;
   a second filter configured for receiving a signal from said first filter and applying an additional selected delay to the signal received by said first filter; and
   a second mechanism for activating said second filter to produce a delayed signal which is a function of a signal received from said first filter wherein said second mechanism is settable to produce a predetermined signal delay according to the input from the microprocessor.

2. The delay system according to claim 1, wherein said microprocessor is configured to set or modify register values which provide at least one of a coarse delay setting and a fine delay setting for the selected input signal to be delayed.

3. The delay system according to claim 1, wherein said first filter is a SINC filter.

4. The delay system according to claim 1, wherein said first mechanism includes a divider system for counting the passage of time from sampling, according to a reduced clock rate.

5. The delay system according to claim 3, wherein said SINC filter is configured to provide a selectably variable delay amount to a selected input.

6. The delay system according to claim 1, wherein said first filter includes an integrator and a differentiator connected to the integrator at an output terminal of the integrator.

7. The delay system according to claim 1, wherein said second filter is a filter selected from a group including a finite impulse response (FIR) filter and an infinite impulse response (IIR) filter.

8. The delay system according to claim 1, wherein the first mechanism determines the selected input signal by taking a pre-determined, time sample of the input from the microprocessor and wherein an amount of the predetermined delay depends on an amplitude of the pre-determined, time sample.

9. The delay system according to claim 1, wherein the first mechanism and the second mechanism determine the selected input signal by taking a pre-determined, time sample of the input from the microprocessor and wherein an amount of the predetermined delay depends on an amplitude of the pre-determined, time sample.

10. The delay system according to claim 1, further comprising a divider system for dividing an input clock signal to produce a reduced clock rate.

11. The delay system according to claim 10, wherein said divider system includes first and second dividers.

12. The delay system according to claim 1, wherein said first mechanism further comprises a first comparator and a first register connected to said first comparator.

13. The delay system according to claim 12, wherein said second mechanism comprises a divider for dividing an input clock signal to produce a reduced clock rate.

14. The delay system according to claim 13, wherein said second mechanism comprises a second comparator and a second register connected to said second comparator.

15. The delay system according to claim 1, wherein said first filter includes first and second stages.

16. The delay system according to claim 15, wherein said first stage operates at a higher signal sampling rate than said rate of said second stage.

17. The delay system according to claim 16, wherein said second stage operates at a lower signal sampling rate than said rate of said first stage.

18. The delay system according to claim 17, wherein said second stage has a sampling time controlled by an output signal from a first comparator.

19. The delay system according to claim 18, further comprising a divide counter, wherein said first comparator actuates when the contents of a writeable register, written to/from said microprocessor, is equal to the output signal of the divide counter.

20. The delay system according to claim 19, further comprising a register and a second divide counter, wherein the time of sampling by said second filter is controlled by an output signal from a comparator which actuates when the contents of the register, written to/from said microprocessor, is equal to the output of the second divide counter.

21. The delay system according to claim 1, wherein said first filter provides a selectable fine delay and said second filter provides a selectable coarse delay.

22. A method of delaying a received signal, comprising:
   sampling a selected signal with a predetermined clock signal;
   producing the selected signal at a time that is delayed to the extent of a comparison of a reduced frequency clock with a predetermined value; and
   delaying production of said selected signal with a second comparison with a second predetermined value of a further reduced frequency clock whose frequency is reduced relative to said frequency of said reduced frequency clock.

23. A delay system comprising:
   a first filter configured to receive a selected input signal;
   a first mechanism, including a microprocessor, for activating the filter to produce a delayed output signal which is a function of the selected input signal, the first mechanism being settable to produce a predetermined delay according to an input from the microprocessor;
   a second filter configured to receive a signal from said first filter and to apply an additional delay to the signal received by said first filter; and
   a second mechanism for activating said second filter to produce a delayed signal which is a function of a signal received from said first filter wherein said second mechanism is settable to produce a predetermined signal delay according to the input from the microprocessor.

24. The delay system according to claim 23, further comprising a divider system for tracking times from a reference timer, where at least one tracked time is used to trigger at least a single filter to produce a delayed output signal.

25. The delay system according to claim 23, wherein the first mechanism and the second mechanism determine the selected input signal by taking a predetermined, time sample of the input from the microprocessor and wherein an amount of the predetermined delay depends on an amplitude of the pre-determined, time sample.

26. The delay system according to claim 23, wherein said first and second filters provide respective first and second delays in the selected input signal.

* * * * *